(12) United States Patent
Wu et al.

(10) Patent No.: US 12,262,511 B2
(45) Date of Patent: Mar. 25, 2025

(54) TWO-PHASE IMMERSION-TYPE HEAT DISSIPATION DEVICE HAVING REINFORCED FINS

(71) Applicant: AMULAIRE THERMAL TECHNOLOGY, INC., New Taipei (TW)

(72) Inventors: Chun-Te Wu, New Taipei (TW); Ching-Ming Yang, New Taipei (TW); Yu-Wei Chiu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 229 days.

(21) Appl. No.: 18/097,665

(22) Filed: Jan. 17, 2023

(65) Prior Publication Data

US 2024/0244793 A1     Jul. 18, 2024

(51) Int. Cl.
*F28F 7/00*     (2006.01)
*H05K 7/20*     (2006.01)

(52) U.S. Cl.
CPC .......... *H05K 7/2039* (2013.01); *H05K 7/203* (2013.01)

(58) Field of Classification Search
CPC .............................. H05K 7/2039; H05K 7/203

USPC ....................................................... 165/80.4
See application file for complete search history.

(56) References Cited

U.S. PATENT DOCUMENTS 6,296,048 B1 * 10/2001 Sauer .................. H01L 23/3672
257/722

FOREIGN PATENT DOCUMENTS

CN     209842540 U * 12/2019
FR       1881538 A1 * 1/2008

* cited by examiner

*Primary Examiner* — Davis D Hwu
(74) *Attorney, Agent, or Firm* — Li & Cai Intellectual Property (USA) Office (57) ABSTRACT

A two-phase immersion-type heat dissipation device is provided. The two-phase immersion-type heat dissipation device includes a heat dissipation substrate and a plurality of reinforced fins. The heat dissipation substrate has a first surface and a second surface configured to be in contact with a heating element. The first surface is opposite to the second surface and is arranged away from the heating element. The plurality of reinforced fins are integrally formed on the first surface of the heat dissipation substrate, and a thickness of each of the plurality of reinforced fins is less than 1 mm. According to a scanning electron microscopy image of electron backscattered diffraction, a median of local misorientation distribution of the plurality of reinforced fins is greater than 1.6 times a median of local misorientation distribution of the heat dissipation substrate.

19 Claims, 6 Drawing Sheets

TWO-PHASE IMMERSION-TYPE HEAT DISSIPATION DEVICE HAVING REINFORCED FINS

FIELD OF THE DISCLOSURE

The present disclosure relates to a heat dissipation device, and more particularly to a two-phase immersion-type heat dissipation device having thin fins that undergo a predeformation process.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant.

Generally, common heat dissipation devices adopt thin heat dissipation fins to increase a heat dissipation area; however, it is difficult for two-phase heat dissipation devices to adopt the thin heat dissipation fins, because heat dissipation fins having high heights and thin thicknesses have lower structural strength and are easily deformed and warped. In the immersion cooling technology, a large amount of air bubbles are generated during heat dissipation, and the air bubbles between heat dissipation fins cause a lateral pushing force such that the heat dissipation fins are deformed and warped. Therefore, how to adopt a heat dissipation device having thin heat dissipation fins to the immersion cooling technology for heat dissipation without the thin heat dissipation fins becoming deformed from being pushed by the air bubbles is an issue to be addressed in the present disclosure.

SUMMARY OF THE DISCLOSURE

In response to the above-referenced technical inadequacy, the present disclosure provides a two-phase immersion-type heat dissipation device having reinforced fins.

In one aspect, the present disclosure provides a two-phase immersion-type heat dissipation device. The two-phase immersion-type heat dissipation device includes a heat dissipation substrate, and a plurality of reinforced fins. The heat dissipation substrate has a first surface and a second surface that is configured to be in contact with a heating element immersed in a two-phase coolant. The first surface is opposite to the second surface and is arranged away from the heating element. The plurality of reinforced fins are integrally formed on the first surface of the heat dissipation substrate, wherein a thickness of each of the plurality of reinforced fins is less than 1 mm. A microstructure of the plurality of reinforced fins is different from a microstructure of the heat dissipation substrate. According to a scanning electron microscopy image of electron backscattered diffraction, a median of local misorientation distribution of the plurality of reinforced fins is greater than 1.6 times a median of local misorientation distribution of the heat dissipation substrate.

In certain embodiments, the heat dissipation substrate is made of copper, copper alloy, or aluminum alloy.

In certain embodiments, the plurality of reinforced fins are made of copper, copper alloy, or aluminum alloy.

In certain embodiments, the plurality of reinforced fins are plate-fins or pin-fins.

In certain embodiments, the plurality of reinforced fins are made by bending, forging, or extruding.

In certain embodiments, in the scanning electron microscopy image of electron backscattered diffraction, an area of calculation is a square of 3 pixels by 3 pixels, and a mean difference between an orientation angle of a core pixel and orientation angles of each of adjacent pixels is calculated. The orientation angles are less than 5 degrees.

In certain embodiments, the median of local misorientation distribution of the plurality of reinforced fins is between 1.5 and 3.

In certain embodiments, a ratio of a thickness of each of the reinforced fins to a distance between two adjacent ones of the reinforced fins is between 0.7 and 1.5.

In certain embodiments, a height of each of the reinforced fins is 15 times or more the thickness of each of the reinforced fins.

In certain embodiments, a length of each of the reinforced fins is 200 times or more the thickness of each of the reinforced fins.

Therefore, in the two-phase immersion-type heat dissipation device having reinforced fins, by virtue of "a microstructure of the plurality of reinforced fins being different from a microstructure of the heat dissipation substrate, and according to a scanning electron microscopy image of electron backscattered diffraction, a median of local misorientation distribution of the plurality of reinforced fins being greater than 1.6 times a median of local misorientation distribution of the heat dissipation substrate," structural strength of the fins can be ensured, and the two-phase immersion-type heat dissipation device having reinforced fins can be used in the immersion cooling technology. Furthermore, high surface area of the fins can be used to dissipate heat, such that a thermal conductivity in a vertical direction can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment

Figure 1:
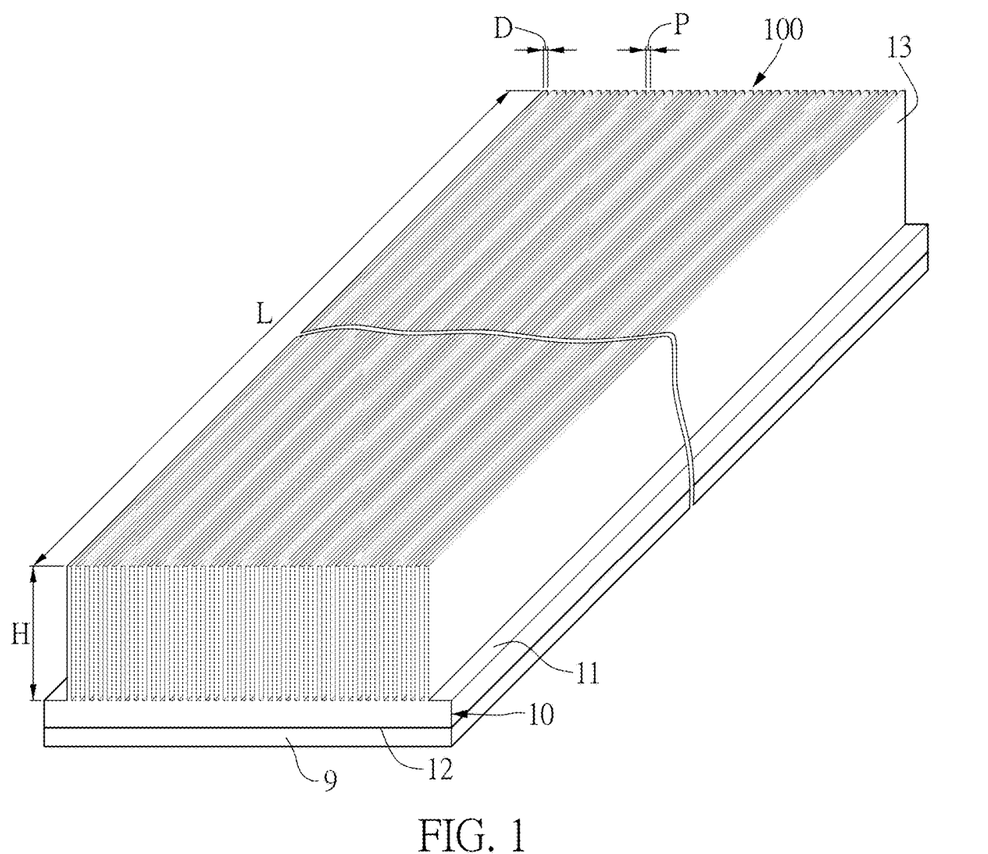
FIG. 1 is a schematic perspective view of a two-phase immersion-type heat dissipation device having reinforced fins of the present disclosure.

Referring to FIG. 1, one embodiment of the present disclosure provides a two-phase immersion-type heat dissipation device 100 having reinforced fins for contacting a heating element 9 immersed in a two-phase coolant. The two-phase immersion-type heat dissipation device 100 having reinforced fins is referred to as the heat dissipation device 100 hereinafter for sake of brevity. More specifically, in the present disclosure, a two-phase immersion-type compound heat dissipation structure that includes a highly thermally conductive substrate and a plurality of high strength fins is provided. The heat dissipation device 100 includes a heat dissipation substrate 10 and a plurality of reinforced fins 13. A microstructure of the reinforced fins 13 is different from a microstructure of the heat dissipation substrate 10.

The heat dissipation substrate 10 can be made of a material having high thermal conductivity, such as copper, copper alloy, or aluminum alloy. Furthermore, the heat dissipation substrate 10 can be plate-shaped and has a first surface 11 and a second surface 12 that are opposite to each other. The second surface 12 is configured to be in contact with a heating element 9 immersed in a two-phase coolant. The first surface 11 is opposite to the second surface 12 and is arranged away from the heating element 9. The heating element 9 is immersed in the two-phase coolant (omitted in the figures), and the second surface 12 can be in contact with the heating element 9 directly, or indirectly via an intermediate layer (omitted in the figures).

The plurality of reinforced fins 13 are integrally formed on the first surface 11 of the heat dissipation substrate 10. In this embodiment, the plurality of reinforced fins are thin fins, a thickness of each of the plurality of reinforced fins 13 is less than 1 mm, and the thickness can range from 0.5 mm to 1 mm. Preferably, the thickness of each of the plurality of reinforced fins 13 is less than 0.5 mm. The reinforced fins in the present disclosure are fins that undergo certain predeformation processes to improve on the strength of the fins for withstanding deformation.

In this embodiment, the reinforced fins 13 can be made of a metal such as copper, copper alloy, or aluminum alloy, the reinforced fins 13 can be formed by bending, forging, or extruding, and the reinforced fins 13 can be pin-fins or plate-fins. As mentioned above, the thickness of each of the reinforced fins 13 is less than 1 mm. When the reinforced fins are implemented as plate fins, a height of each of the reinforced fins 13 is preferably 15 times or more the thickness of each of the reinforced fins 13. For example, when a thickness D of each of the reinforced fins 13 is less than 0.5 mm, a height H of each of the reinforced fins 13 can be greater than 7.5 mm. Moreover, a length of each of the reinforced fins 13 is 200 times or more the thickness of each of the reinforced fins 13. For example, when the thickness D of each of the reinforced fins 13 is less than 0.5 mm, the length L of each of the reinforced fins 13 can be greater than 10 cm. In the present disclosure, the fins can be prevented from having an excessive height or length that may result in insufficient structural strength of the fins for withstanding stress generated in immersion cooling.

In addition, a ratio of the thickness D of each of the reinforced fins 13 to a distance P between two adjacent ones of the reinforced fins 13 is between 0.7 and 1.5. For example, when the thickness D of each of the reinforced fins 13 is less than 0.5 mm, the distance P between two adjacent ones of the reinforced fins 13 is between 0.35 (0.5*0.7) mm and 0.75 (0.5*1.5) mm.

Technical characteristics of the reinforced fins 13 that are processed in the present embodiment are described via the heat dissipation device 100 made of copper and a scanning electron microscopy image of electron backscattered diffraction. The microstructure of the reinforced fins 13 is different from the microstructure of the heat dissipation substrate 10, and the structural strength of the reinforced fins 13 is suitable to be in contact with the heating element 9 that is immersed in the two-phase coolant.

The electron back scatter diffraction (EBSD) is a technology that identifies a crystalline orientation of metal by using an electron beam that is diffracted. In this embodiment, the heat dissipation device 100 to be observed is loaded into a scanning electron microscope, and the electron beam after acceleration is projected to substrate or fins of the heat dissipation device 100; afterwards, back scatter electrons bounce back and are diffracted through surface structure of crystals to enter a sensor while carrying crystalline orientation information of surfaces of the substrate or fins of the heat dissipation device 100. Therefore, orientations of each crystal grain can be determined, and after orientations of each crystal grain is obtained, a stress or other information can be determined.

The determination is carried out by using software to calculate misorientations among crystal grains, two ways of determination being grain average misorientation (GAM) and kernel average misorientation (KAM). GAM is a calculation of misorientation based on individual crystal grains. In KAM, kernel average misorientation is calculated based on scanned pixels, and all adjacent pixels of a central pixel are assessed for confirming a way in which an orientation of the central pixel is assessed. In other words, KAM calculates deviations between a central point of a kernel and all surrounding points of the kernel and obtains an average value of the deviations, so as to acquire a local deviation of the central point. The present embodiment uses KAM for determination, and a basic unit for capturing is 3×3 pixels (1 μm*1 μm).

Figure 2A:
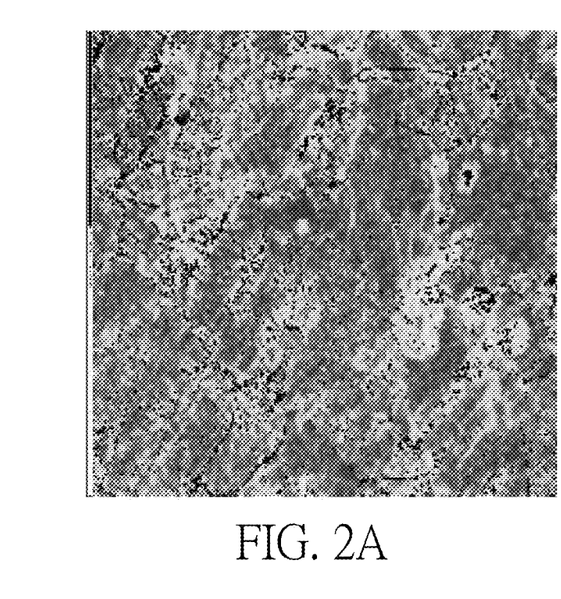
FIG. 2A is a scanning electron microscopy image of a heat dissipation substrate of the present disclosure.
Figure 2B:
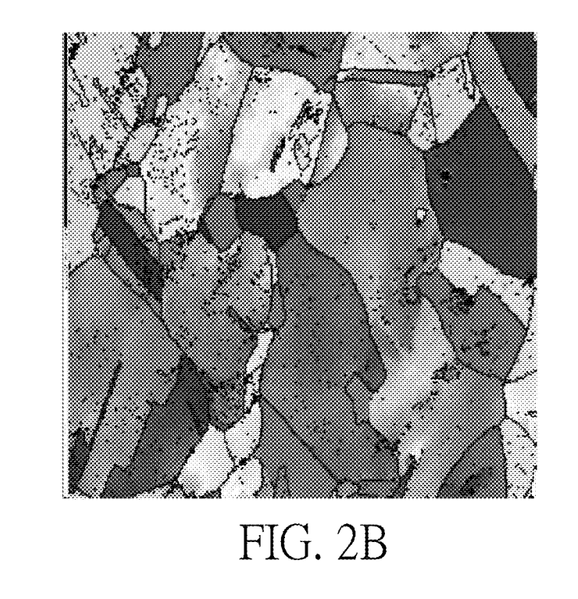
FIG. 2B is an image of pixels showing high misorientation (greater than 5 degrees) captured from FIG. 2A.
Figure 3:
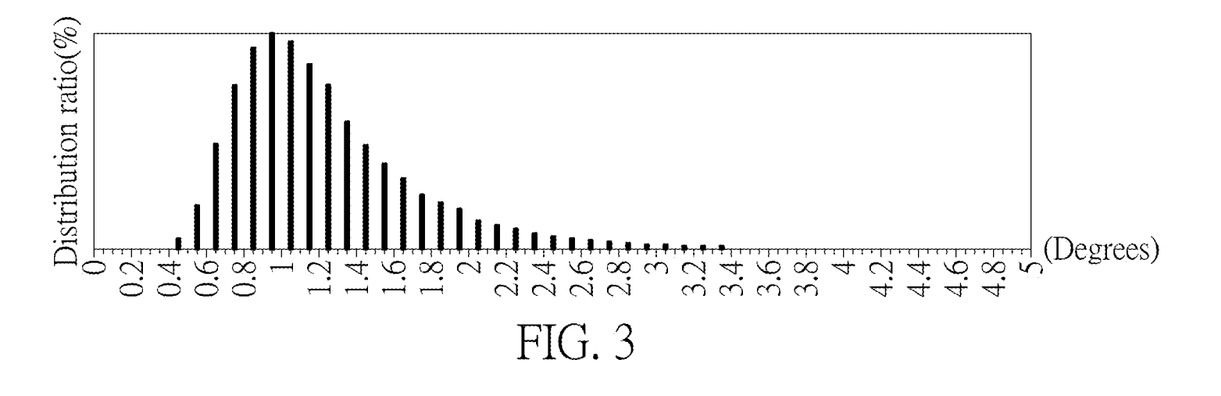
FIG. 3 is a chart showing local misorientation distribution of the heat dissipation substrate of the present disclosure.

As shown in FIG. 2A, FIG. 2B, and FIG. 3, FIG. 2A is a scanning electron microscopy image of a heat dissipation substrate of the present disclosure, and FIG. 2B is an image of pixels showing high misorientation (greater than 5 degrees) captured from FIG. 2A. After analysis by software, a chart showing local misorientation distribution of the heat dissipation substrate of the present disclosure is as shown in FIG. 3, in which a horizontal axis indicates a range from 0 degrees to 5 degrees, and a vertical axis indicates a distribution ratio.

Figure 4A:
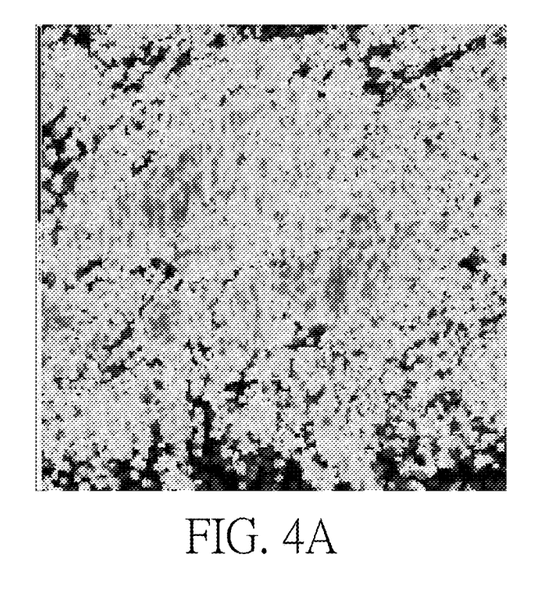
FIG. 4A is a scanning electron microscopy image of reinforced fins of the present disclosure.
Figure 4B:
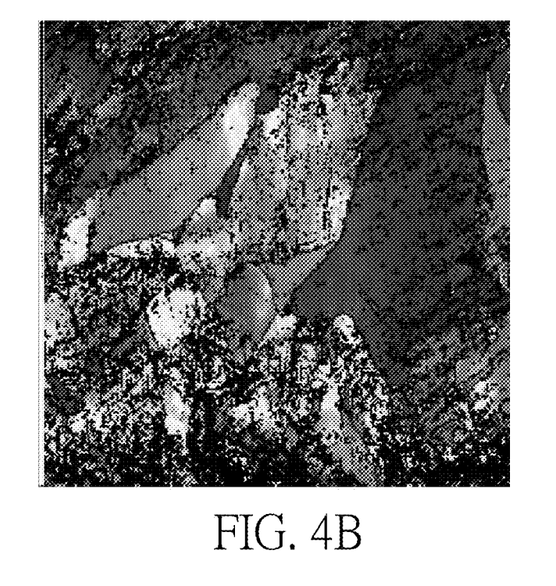
FIG. 4B is an image of pixels showing high misorientation (greater than 5 degrees) captured from FIG. 4A.
Figure 5:
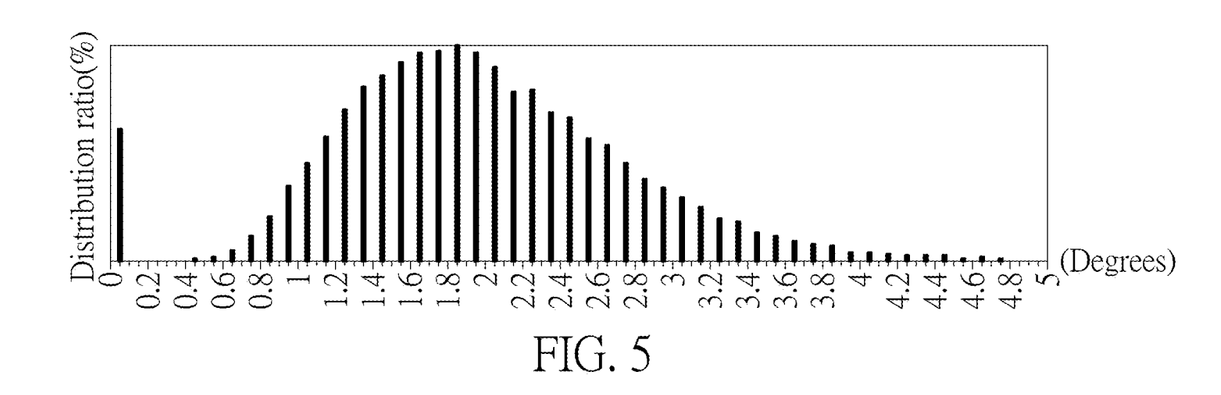
FIG. 5 is a chart showing local misorientation distribution of the reinforced fins of the present disclosure.

As shown in FIG. 4A, FIG. 4B, and FIG. 5, FIG. 4A is a scanning electron microscopy image of reinforced fins of the present disclosure, and FIG. 4B is an image of pixels showing high misorientation (greater than 5 degrees) captured from FIG. 4A. After analysis by software, a chart showing local misorientation distribution of the reinforced fins of the present disclosure is shown in FIG. 5.

Figure 6A:
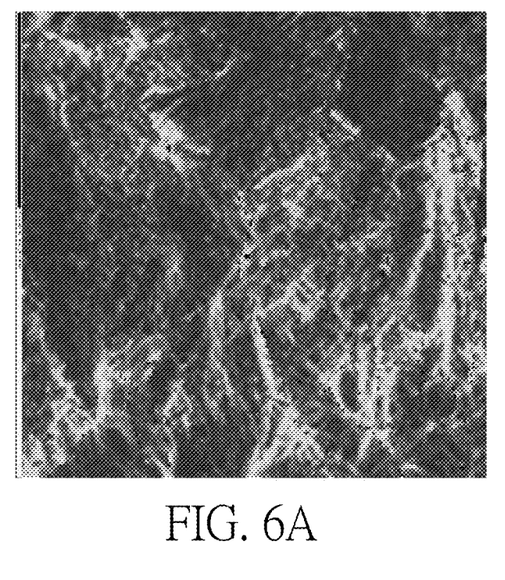
FIG. 6A is an enlarged scanning electron microscopy image of the heat dissipation substrate of the present disclosure.
Figure 6B:
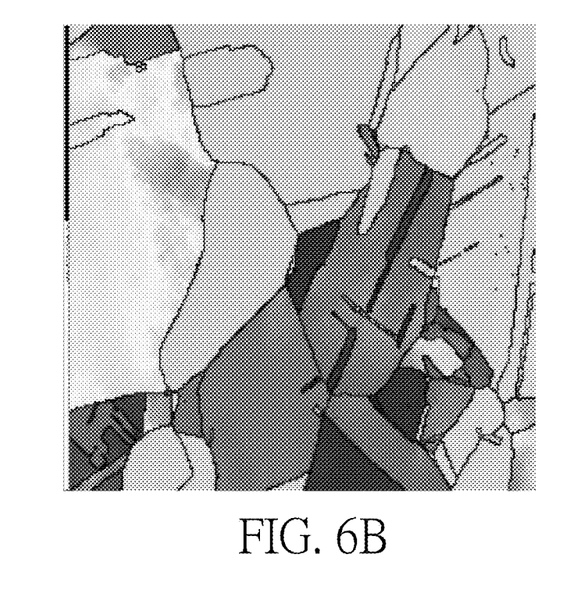
FIG. 6B is an image of pixels showing high misorientation (greater than 5 degrees) captured from FIG. 6A.
Figure 7:
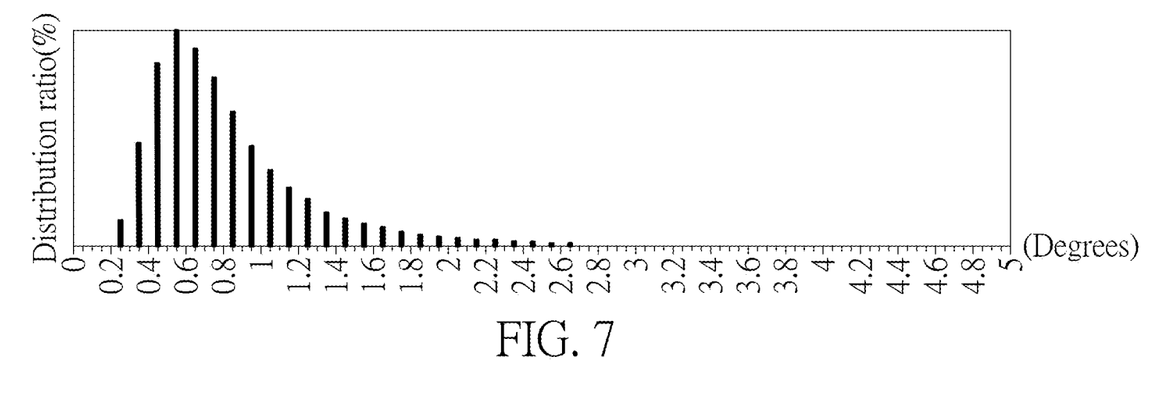
FIG. 7 is another chart showing local misorientation distribution of the heat dissipation substrate of the present disclosure.

As shown in FIG. 6A, FIG. 6B, and FIG. 7, FIG. 6A is an enlarged scanning electron microscopy image of the heat dissipation substrate of the present disclosure, and FIG. 6B is an image of pixels showing high misorientation (greater than 5 degrees) captured from FIG. 6A. After analysis by software, another chart showing local misorientation distribution of the heat dissipation substrate of the present disclosure is as shown in FIG. 7, in which a horizontal axis indicates a range from 0 degrees to 5 degrees, and a vertical axis indicates a distribution ratio.

Figure 8A:
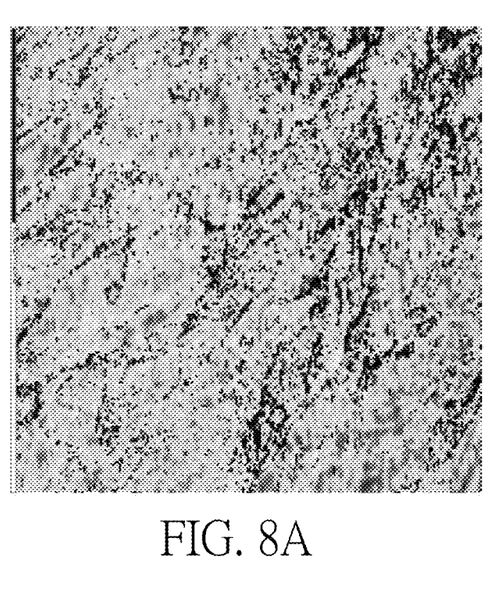
FIG. 8A is an enlarged scanning electron microscopy image of the reinforced fins of the present disclosure.
Figure 8B:
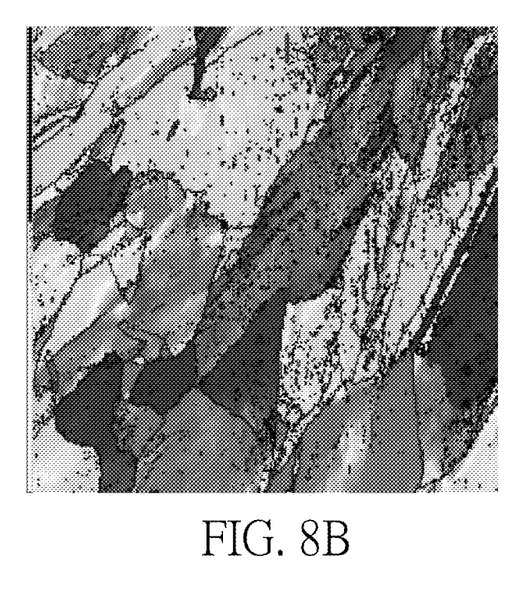
FIG. 8B is an image of pixels showing high misorientation (greater than 5 degrees) captured from FIG. 8A.
Figure 9:
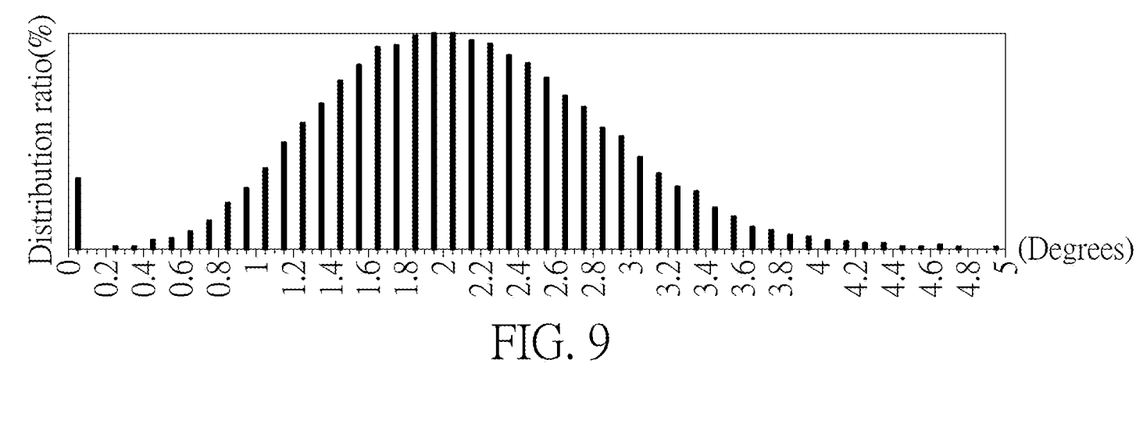
FIG. 9 is another chart showing local misorientation distribution of the reinforced fins of the present disclosure.

As shown in FIG. 8A, FIG. 8B, and FIG. 9, FIG. 8A is an enlarged scanning electron microscopy image of the reinforced fins of the present disclosure, and FIG. 8B is an image of pixels showing high misorientation (greater than 5 degrees) captured from FIG. 8A. After analysis by software, another chart showing local misorientation distribution of the reinforced fins of the present disclosure is shown in FIG. 9.

In the aforementioned scanning electron microscopy image of electron backscattered diffraction, an area of calculation is a square of 3 pixels by 3 pixels, and a mean difference between an orientation angle of a core pixel and orientation angles of each of adjacent pixels is calculated. Furthermore, the orientation angles are less than 5 degrees.

From the abovementioned figures, it can be observed that the median of local misorientation distribution of the plurality of reinforced fins is between 1.5 and 3.

After further analysis, a median of local misorientation distribution of the plurality of reinforced fins 13 is greater than 1.6 times a median of local misorientation distribution of the heat dissipation substrate 10.

Figure 10:
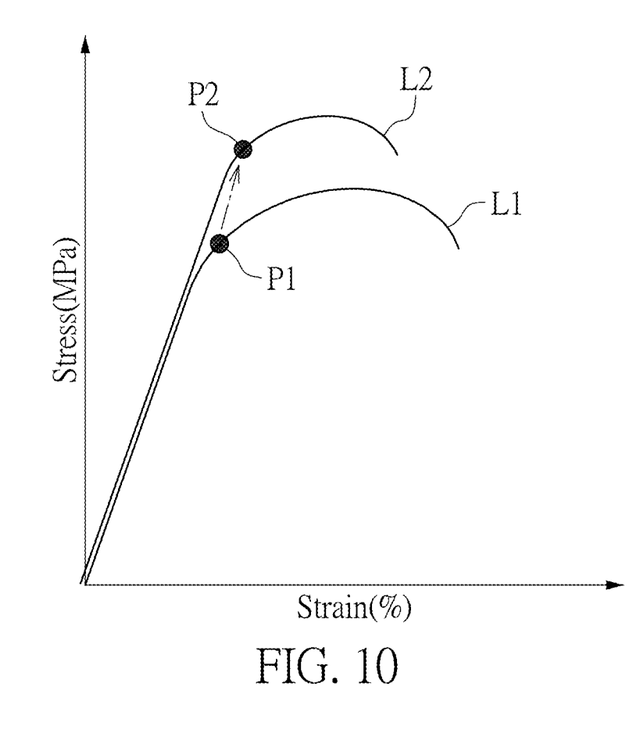
FIG. 10 is a chart of stress-strain curves of the reinforced fins of the present disclosure before and after predeformation.

Reference is made to FIG. 10, which is a chart of stress-strain curves of the reinforced fins of the present disclosure before and after predeformation. A lower curve L1 indicates a fin of a comparative group without predeformation, and an upper curve L2 indicates a fin of the present disclosure with predeformation. It can be observed that a yield point P2 of the upper curve L2 is greater than a yield point P1 of the lower curve L1. In other words, the reinforced fins 13 of the present disclosure have stronger structural strength and are able to withstand a greater stress.

Accordingly, the two-phase immersion-type heat dissipation device 100 having reinforced fins of the present disclosure is in contact with the heating element immersed in the two-phase coolant, and heat generated by the heating element can be emitted to the heat dissipation substrate 10. Furthermore, the heat can be transmitted to the reinforced fins 13 of the heat dissipation substrate 10. The reinforced fins 13 have stronger structural strength to withstand a pushing force from air bubbles in the two-phase coolant. Therefore, heat absorbed by the reinforced fins 13 having high thermal conductivity is removed through an endothermic gasification process of the two-phase coolant.

Beneficial Effects of the Embodiment

In conclusion, in the two-phase immersion-type heat dissipation device having reinforced fins, by virtue of "according to a scanning electron microscopy image of electron backscattered diffraction, a median of local misorientation distribution of the plurality of reinforced fins being greater than 1.6 times a median of local misorientation distribution of the heat dissipation substrate," structural strength of the fins can be ensured, and the two-phase immersion-type heat dissipation device having reinforced fins can be used in the immersion cooling technology without deformation from being pushed by the air bubbles. Furthermore, high surface area of the fins can be used to dissipate heat, such that a thermal conductivity in a vertical direction can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation device, comprising:
   a heat dissipation substrate having a first surface and a second surface that is configured to be in contact with a heating element immersed in a two-phase coolant, wherein the first surface is opposite to the second surface and is arranged away from the heating element; and a plurality of reinforced fins integrally formed on the first surface of the heat dissipation substrate, wherein a thickness of each of the plurality of reinforced fins is less than 1 mm;

wherein a microstructure of the plurality of reinforced fins undergoes a predeformation process so as to be different from a microstructure of the heat dissipation substrate; wherein, according to a scanning electron microscopy image of electron backscattered diffraction, a median of local misorientation distribution of the plurality of reinforced fins is greater than 1.6 times a median of local misorientation distribution of the heat dissipation substrate, so as to determine orientations of each crystal grain of the plurality of reinforced fins to ensure a structural strength to withstand a pushing force from air bubbles in the two-phase coolant.

2. The two-phase immersion-type heat dissipation device according to claim 1, wherein the heat dissipation substrate is made of copper, copper alloy, or aluminum alloy.

3. The two-phase immersion-type heat dissipation device according to claim 1, wherein the plurality of reinforced fins are made of copper, copper alloy, or aluminum alloy.

4. The two-phase immersion-type heat dissipation device according to claim 1, wherein the plurality of reinforced fins are plate-fins or pin-fins.

5. The two-phase immersion-type heat dissipation device according to claim 1, wherein the plurality of reinforced fins are made by bending, forging, or extruding.

6. The two-phase immersion-type heat dissipation device according to claim 1, wherein, in the scanning electron microscopy image of electron backscattered diffraction, an area of calculation is a square of 3 pixels by 3 pixels, and a mean difference between an orientation angle of a core pixel and orientation angles of each of adjacent pixels is calculated, and wherein the orientation angles are less than 5 degrees.

7. The two-phase immersion-type heat dissipation device according to claim 6, wherein the median of local misorientation distribution of the plurality of reinforced fins is between 1.5 and 3.

8. The two-phase immersion-type heat dissipation device according to claim 1, wherein a ratio of a thickness of each of the reinforced fins to a distance between two adjacent ones of the reinforced fins is between 0.7 and 1.5.

9. The two-phase immersion-type heat dissipation device according to claim 1, wherein a height of each of the reinforced fins is 15 times or more the thickness of each of the reinforced fins.

10. The two-phase immersion-type heat dissipation device according to claim 1, wherein a length of each of the reinforced fins is 200 times or more the thickness of each of the reinforced fins.

11. A two-phase immersion-type heat dissipation device, comprising:

a heat dissipation substrate having a first surface and a second surface that is configured to be in contact with a heating element immersed in a two-phase coolant, wherein the first surface is opposite to the second surface and is arranged away from the heating element; and a plurality of reinforced fins integrally formed on the first surface of the heat dissipation substrate, wherein a thickness of each of the plurality of reinforced fins is less than 1 mm;

wherein a microstructure of the plurality of reinforced fins is different from a microstructure of the heat dissipation substrate; wherein, according to a scanning electron microscopy image of electron backscattered diffraction, a median of local misorientation distribution of the plurality of reinforced fins is greater than 1.6 times a median of local misorientation distribution of the heat dissipation substrate;

wherein, in the scanning electron microscopy image of electron backscattered diffraction, an area of calculation is a square of 3 pixels by 3 pixels, and a mean difference between an orientation angle of a core pixel and orientation angles of each of adjacent pixels is calculated, and wherein the orientation angles are less than 5 degrees.

12. The two-phase immersion-type heat dissipation device according to claim 11, wherein the heat dissipation substrate is made of copper, copper alloy, or aluminum alloy.

13. The two-phase immersion-type heat dissipation device according to claim 11, wherein the plurality of reinforced fins are made of copper, copper alloy, or aluminum alloy.

14. The two-phase immersion-type heat dissipation device according to claim 11, wherein the plurality of reinforced fins are plate-fins or pin-fins.

15. The two-phase immersion-type heat dissipation device according to claim 11, wherein the plurality of reinforced fins are made by bending, forging, or extruding.

16. The two-phase immersion-type heat dissipation device according to claim 11, wherein the median of local misorientation distribution of the plurality of reinforced fins is between 1.5 and 3.

17. The two-phase immersion-type heat dissipation device according to claim 11, wherein a ratio of a thickness of each of the reinforced fins to a distance between two adjacent ones of the reinforced fins is between 0.7 and 1.5.

18. The two-phase immersion-type heat dissipation device according to claim 11, wherein a height of each of the reinforced fins is 15 times or more the thickness of each of the reinforced fins.

19. The two-phase immersion-type heat dissipation device according to claim 11, wherein a length of each of the reinforced fins is 200 times or more the thickness of each of the reinforced fins.

* * * * *